United States Patent [19]
Berth et al.

[11] Patent Number: 6,163,457
[45] Date of Patent: Dec. 19, 2000

[54] MODULE OF A CIRCUIT ARRANGEMENT WHICH IS PREFERABLY CONTAINED IN A DRIVE FOR A RAILROAD VEHICLE AND IS OF MODULAR CONSTRUCTION

[75] Inventors: Matthias Berth, Baden; Rolf Schifferli, Wil, both of Switzerland

[73] Assignee: DaimlerChrysler AG, Stuttgart, Germany

[21] Appl. No.: 09/390,673

[22] Filed: Sep. 7, 1999

[30] Foreign Application Priority Data

Sep. 9, 1998 [DE] Germany ............................ 198 41 133

[51] Int. Cl.⁷ ...................................................... H05K 7/20
[52] U.S. Cl. ............................................................ 361/704
[58] Field of Search ...................................... 361/700–710, 361/601, 604, 626, 622, 641, 642, 657, 658, 690, 696, 697, 816, 818; 200/50 A, 50 B; 307/10.1, 150, 151.82; 363/141, 14, 71, 16, 650, 36, 34, 35, 65–67, 148–149; 105/34.1, 34.2, 35, 49, 62.2, 27, 59, 61, 62.1; 165/80.2, 80.3, 80.4, 165, 185, 104.33, 104.34; 439/911; 123/41.31, 480, 195 E

[56] References Cited

U.S. PATENT DOCUMENTS

| | | | |
|---|---|---|---|
| 3,586,915 | 6/1971 | Urquhart et al. | 317/100 |
| 3,749,981 | 7/1973 | Koltuniak et al. | 317/100 |
| 4,494,706 | 1/1985 | Crafts | 361/696 |
| 4,514,708 | 4/1985 | Ludtke | 333/255 |
| 4,794,509 | 12/1988 | Nussbaumer | 363/141 |
| 4,956,747 | 9/1990 | Beer et al. | |
| 5,504,655 | 4/1996 | Underwood et al. | 361/707 |
| 5,530,635 | 6/1996 | Yashiro | 363/65 |
| 5,583,385 | 12/1996 | Horie et al. | 307/151 |
| 5,735,215 | 4/1998 | Tegeler | 105/34.1 |
| 5,936,833 | 8/1999 | Grossman et al. | 361/638 |
| 5,969,965 | 10/1999 | Byrne et al. | 363/144 |
| 6,052,293 | 4/2000 | Ivner et al. | 363/36 |

FOREIGN PATENT DOCUMENTS

| | | |
|---|---|---|
| 2205038 | 8/1972 | Germany . |
| 4208612A1 | 9/1993 | Germany . |
| 9116755 | 10/1993 | Germany . |
| 19501660A1 | 7/1996 | Germany . |
| 19630284A1 | 1/1998 | Germany . |

*Primary Examiner*—Leo P. PIcard
*Assistant Examiner*—Michael Datskovsky
*Attorney, Agent, or Firm*—Burns, Doane Swecker & Mathis, L.L.P.

[57] ABSTRACT

The module ($M_1$, $M_2$, . . ) has a first power-electronics assembly (4) which is at high voltage, a second power-electronics assembly (6) which is at a lower potential, and a transformer (5) which couples the two assemblies (4, 6) forming a DC isolation point. The first assembly (4) and electrical connections (26, 27) of the transformer (5) which are connected to it are arranged in a dielectric material housing (10) which is normally designed in a cuboid shape. The dielectric material housing (10) in each case has an electrically conductive layer, which is connected to frame or ground potential, on its top surface (11) and bottom surface (12) as well as on its front face (13) which is closed at the front. An electrical connection of the first power-electronics assembly (4) is passed through each of the two side surfaces (14, 15) of the module. This module is preferably used to construct a circuit arrangement which is contained in a drive for a railroad vehicle and is of modular construction, and is distinguished by compact construction, a high power transmission capability and the ability to be replaced easily.

21 Claims, 4 Drawing Sheets

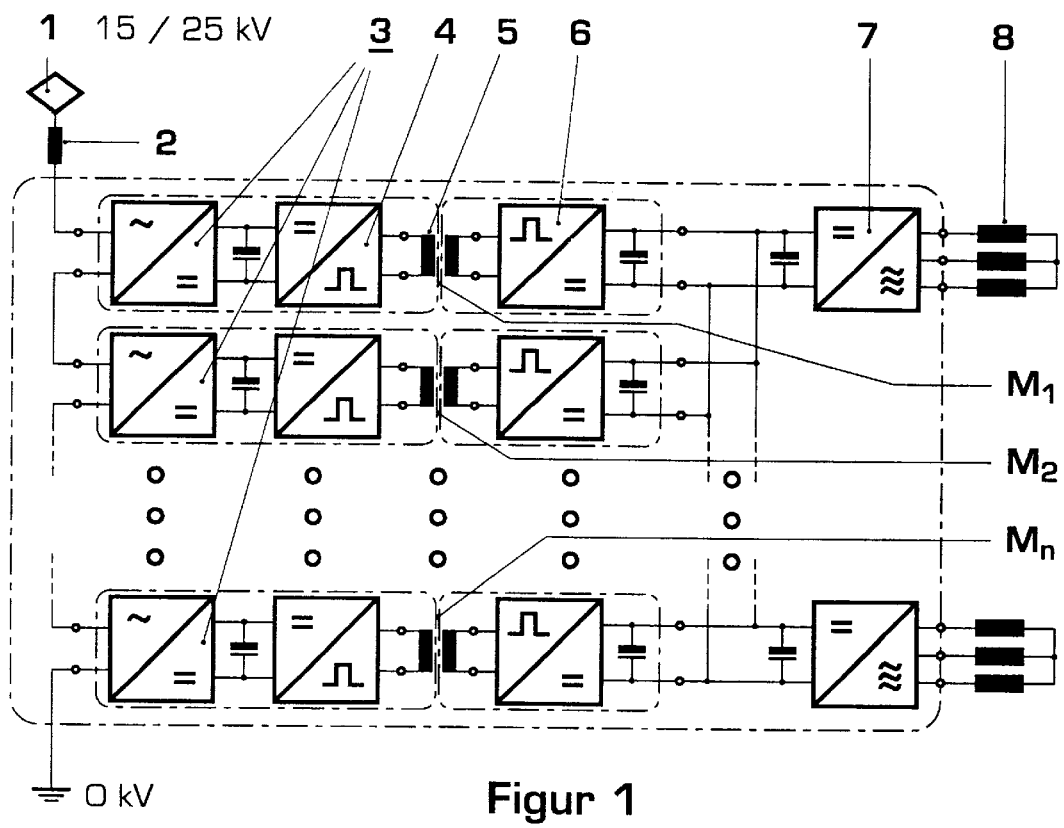
Figur 1
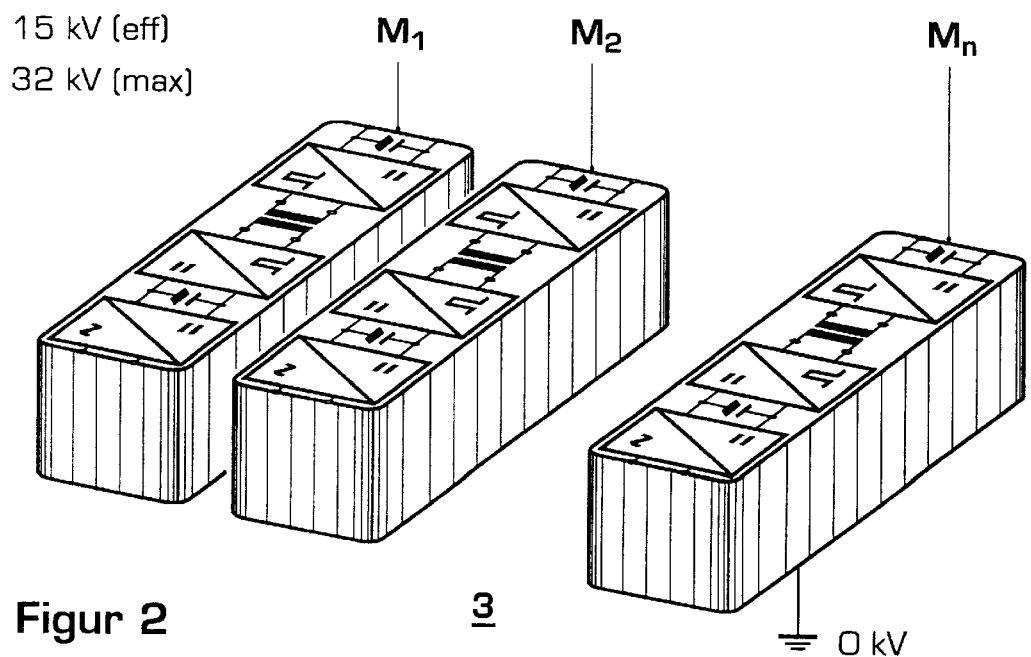
Figur 2

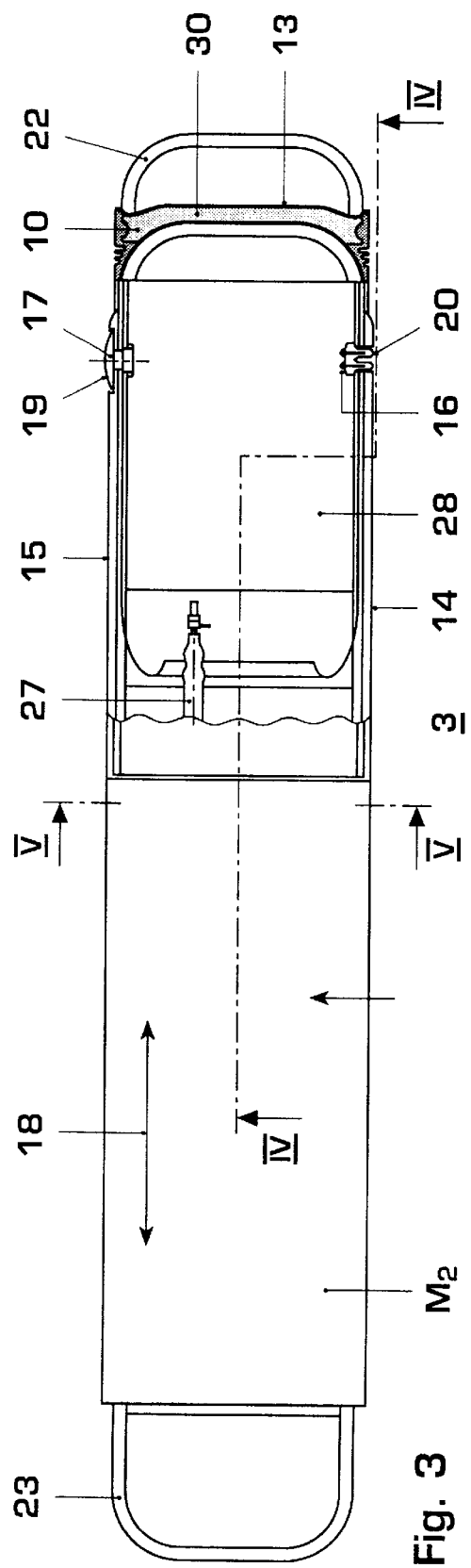
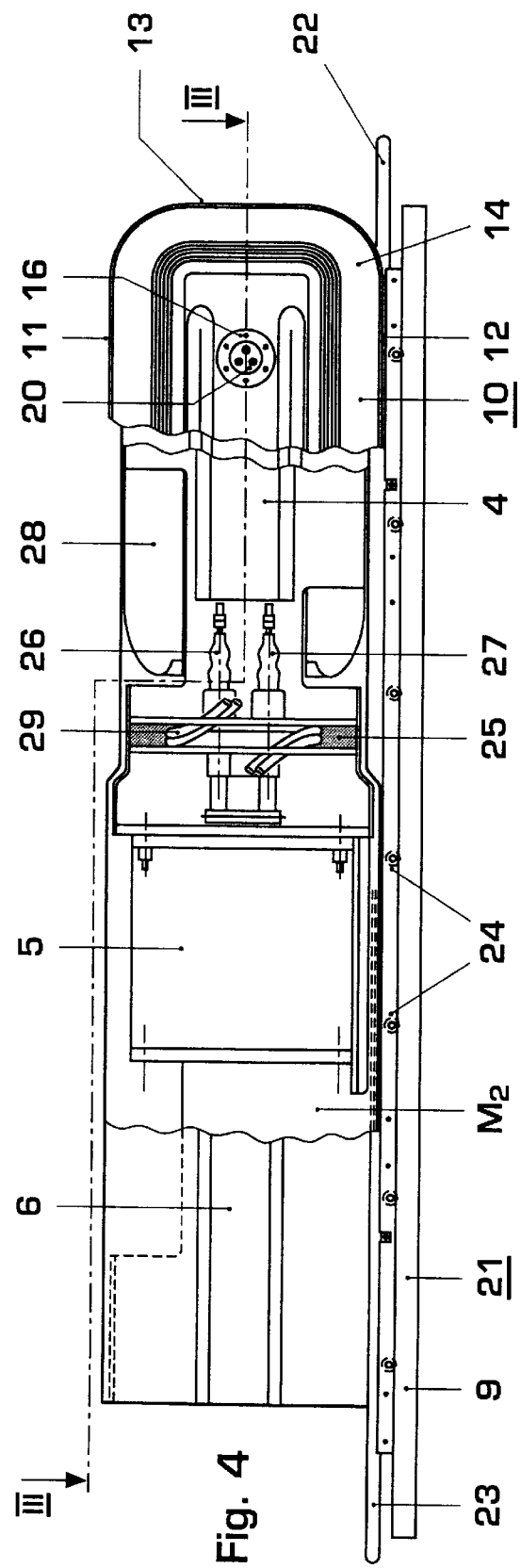

MODULE OF A CIRCUIT ARRANGEMENT WHICH IS PREFERABLY CONTAINED IN A DRIVE FOR A RAILROAD VEHICLE AND IS OF MODULAR CONSTRUCTION

BACKGROUND OF THE INVENTION

1. Field of the Invention

The invention is based on a module of a circuit arrangement which is preferably contained in a drive for a railroad vehicle and is of modular construction, as claimed in the preamble of patent claim 1.

2. Discussion of Background

A module of the abovementioned type is described, in particular in FIG. 6, in DE 196 30 284 A1. The module is a component of a circuit arrangement having n converter modules 40.1, . . . , 41.n which are connected in series with one another and whose outputs are connected parallel with one another. The outputs can be connected to converter modules 41.1, . . . , 41.m each having a traction motor 42.1, . . . , 42.m. The relatively high AC voltage between the traction wire 36 and the rail 37 of a drive for a railroad vehicle is split in the converter modules 40.1, . . . , 40.n corresponding to the number n of converter modules. A low output voltage is present at the outputs of the converter modules 40.1, . . . , 40.n, which is reduced corresponding to the number of modules n, is in each case DC-isolated from the input voltage by a transformer 6 (FIG. 1), and feeds the traction motors 42.1, . . . , 42.m via the converter modules 43.1, . . . , 43.m. Conversely, the traction motors can also feed into the power supply, via the partial converter modules, during braking of the railroad vehicle. Since all the converter modules have only a low voltage applied to them, they can be operated in a cost-effective manner using semiconductor switches 11 (FIG. 1) having a normal withstand voltage.

SUMMARY OF THE INVENTION

Accordingly, one object of the invention as it is specified in the patent claims is to provide a novel module for a circuit arrangement which is of modular construction, is distinguished by a compact construction and is at the same time able to transmit a high power level from high voltage to a load which is at frame or ground potential, and to transmit power emitted by the load at low potential to a high voltage.

In the module according to the invention, at least one first power-electronics assembly which is at high voltage as well as electrical connections (which are connected to this assembly) of a transformer which couples a second power-electronics assembly forming a DC isolation point are arranged in a dielectric material housing which is normally designed in a cuboid shape, and the dielectric material housing in each case has an electrically conductive layer, which is connected to frame or ground potential, on its top surface and bottom surface as well as on its front face which is closed at the front, and an electrical connection of the first power-electronics assembly is passed through each of the two side surfaces of the dielectric material housing. These measures advantageously result in the desired power transmission and, at the same time, a defective module can be removed from the circuit arrangement and can be replaced by a new module in an extremely simple manner.

In an embodiment of the module according to the invention which is particularly highly advantageous for production purposes, the entire transformer as well as the second power-electronics assembly are arranged in the dielectric material housing, and the dielectric material housing furthermore upholds an insulating intermediate wall, which separates the first assembly from the transformer and from the second assembly, and through which the electrical connections of the transformer, which are at high voltage, are passed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows a block diagram of the drive for a railroad vehicle having a circuit arrangement of modular construction, FIG. 2 shows a perspective view of the circuit arrangement shown in FIG. 1, illustrated in highly simplified form, FIG. 3 shows a view of a module $M_2$ according to the invention of the circuit arrangement shown in FIGS. 1 and 2, sectioned along a line III—III which can be seen in FIG. 4, FIG. 4 shows a side view of the module $M_2$ shown in FIG. 3, sectioned along the line IV—IV, in which a part of the module which is not sectioned is illustrated slightly enlarged.

DESCRIPTION OF THE PREFERRED EMBODIMENT

Figure 5:
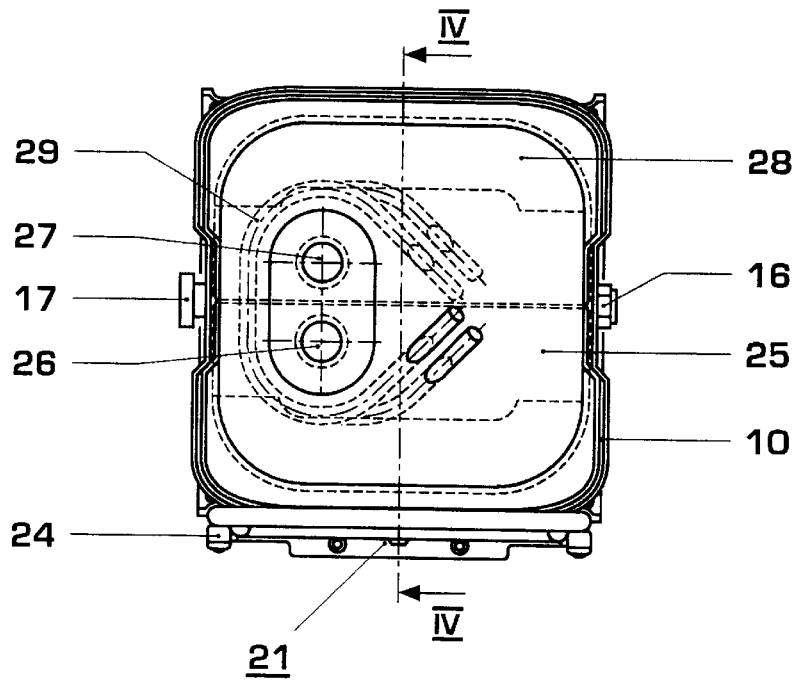
FIG. 5 shows a view from the left of the module $M_2$ shown in FIG. 3, sectioned along the line V—V.

Referring now to the drawings, wherein like reference numerals designate identical or corresponding parts throughout the several views, the drive for a railroad vehicle, which is illustrated as a block diagram, contains an electrical pick-up 1, which can be guided on a high-voltage cable with an AC voltage of, for example, 15 or 25 kV and is connected via an input induction coil 2 to a first input (which is at high potential) of a circuit arrangement 3. A second input of the circuit arrangement 3 is connected to ground potential or frame. The circuit arrangement 3 is formed from n (n=2, 3, . . . ) series-connected power-electronics modules $M_1$, $M_2$, . . . $M_n$ which each have a DC isolation point and of which the module $M_1$ is at high voltage and the module $M_n$ is at frame or ground potential. The modules are of identical design and each have power electronics, which are surrounded by a dielectric material housing and are designed as a converter system, as well as two inputs, one of which is connected to the upstream module in series circuit, and a second of which is connected to the downstream module in the series circuit. In contrast to this, the first input of the module $M_1$ is at high voltage, and the second input of the module $M_n$ is at ground potential or frame. Each module has a power-electronics assembly 4 which is connected to the two inputs, a transformer 5 which forms a DC isolation point, and a power-electronics assembly 6 which is connected downstream of the transformer 5 and has two outputs which pass out of the module. The outputs lie parallel and are connected via m(m=1, 2, . . . ) converter systems 7 to m drives 8.

As can be seen from FIGS. 2 to 6, the modules have an essentially cuboid design and are arranged parallel to one another and at a short distance apart from one another compared with their height, on a plate 9 (FIG. 4) which is at frame or ground potential. The modules each have a dielectric material housing 10 which is designed predominantly in a cuboid shape. On their top surface 11 and bottom surface 12 as well as their front face 13 (which is closed at the front) the dielectric material housings 10 each have an electrically conductive layer which can be kept at frame or ground potential. One electrical connection for a contact of a contact arrangement which produces the series circuit of the assemblies 4 is in each case passed through the mutually facing side surfaces 14, 15 of two respective adjacent modules.

The modules $M_1$, $M_2$ . . . are each mounted moveably on the plate 9, at right angles to the front face 13 of the dielectric material housing 10. The contact arrangement can be operated by moving two adjacent modules with respect to one another. One of the two contacts 16, 17 of the contact arrangement, namely the contact 17, has a guide surface 19 which is inclined with respect to the pushing direction (double arrow 18 in FIG. 3), interacts with the mating contact 16 on movement and, depending on the direction in which the module is pushed, is engaged with or disengaged from pins 20, which are mounted in a sprung manner, of the mating contact 16.

It can be seen from FIG. 4 that there is an essentially rectangular guide element 21, in the form of a carriage and with handles 22, 23, on the bottom surface of the module $M_2$. On its longitudinal sides which act as runners, this guide element has rollers 24, which are guided on two rails (which are not shown) that are formed in the plate 9. The handles project beyond the dielectric material housing 10 on the front face 13 and/or rear face of the dielectric material housing 10.

Figure 6:
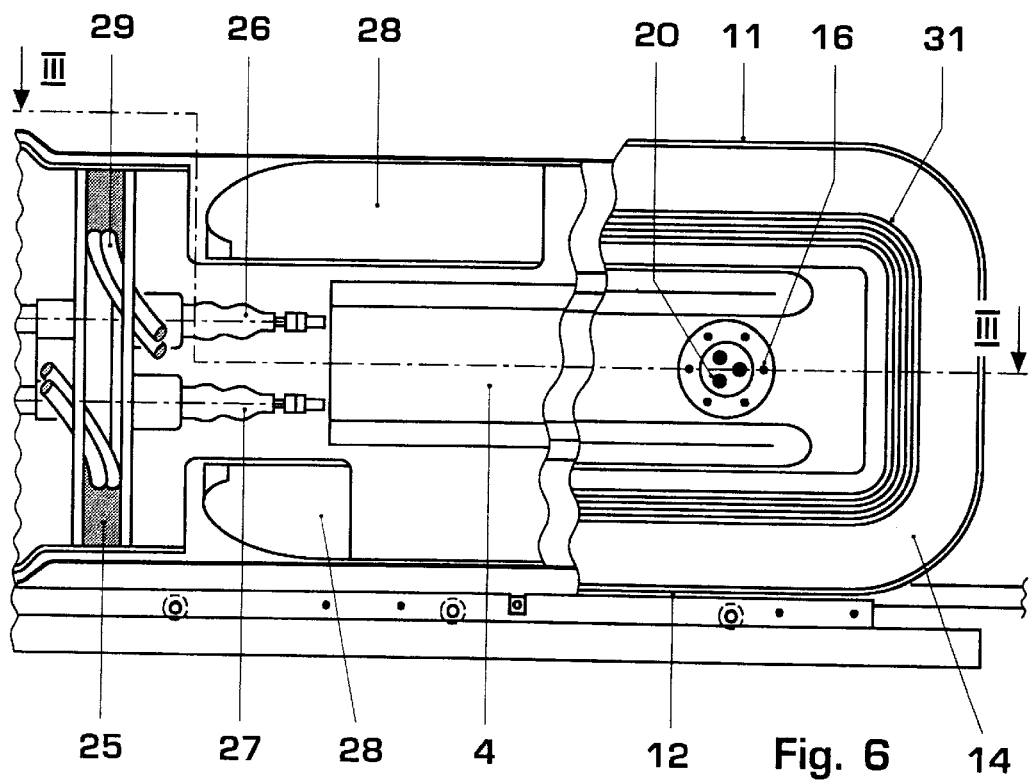
FIG. 6 shows an enlarged illustration of a part of the module shown in FIG. 4.

FIGS. 4 to 6 furthermore show that the transformer 5 and the power-electronics assembly 6 are arranged in the dielectric material housing, and that the dielectric material housing 10 furthermore accommodates an insulating intermediate wall 25, which separates the power-electronics assembly 4 (which is arranged in the right-hand part of the dielectric material housing 10) from the transformer 5 and from the second power-electronics assembly 6. The electrical connections of the transformer 5, which are at high voltage, are passed through the intermediate wall 25. The electrical connections which are passed through the intermediate wall 25 are preferably each designed in the form of a cable termination 26, 27. In consequence, advantageous dielectric characteristics (such as, in particular, a high breakdown strength and a good creepage-current behavior) are obtained, using simple means, at the junction between the power-electronics assembly 4 which is at high voltage and the power-electronics assembly 6 which is at a lower voltage. Particularly advantageous dielectric characteristics are achieved if the cable terminations 26, 27 are firmly connected to the intermediate wall 25 and project into an area of the dielectric material housing 10 which is shielded by a control electrode 28 in the form of a cap and accommodates the power-electronics assembly 4. The dielectric behavior of the module is additionally improved by matching the design of the control electrode 28 to the arrangement and to the configuration of the cable terminations 26, 27.

In order to increase the transmitted power, cooling channels 29 are formed in the insulating intermediate wall 25, through which channels 29 coolant is passed, which is used to cool the power-electronics assemblies 4, 6 and the transformer 5. This coolant is advantageously a liquid, for example water, which is passed through hoses which are laid in the cooling channels 29.

For manufacturing reasons, an embodiment of the module $M_2$, in which the power-electronics assemblies 4 and 6 as well as the transformer 5 are inserted into the dielectric material housing 10, is to be preferred. When servicing is due, the module is then pushed out of the circuit arrangement 3, and the individual assemblies 4, 6 or the transformer 5 can quickly be removed from the dielectric material housing 10. However, it is also possible to keep the dielectric material housing 10 small and to arrange only the power-electronics assembly 4 and the electrical connections to the transformer 5 (which are designed as cable terminations 26, 27) in the dielectric material housing 10.

As can be seen from FIG. 3, the dielectric material housing 10 has, on the front face, a wall section 30 which is designed to be particularly thick in comparison with the wall thickness of the dielectric material housing in the region of the side surfaces 14, 15. This section 30 is designed essentially in U-shape and extends from the top surface 11, over the front face 13, to the bottom surface 12. The U-shaped section 30 ensures electrical insulation between the power-electronics assembly 4 (which may be of high voltage) and the outer surfaces (to which frame or ground potential can be applied and which are provided with electrically conductive layers), namely the top surface 11, front face 13 and bottom surface 12 of the dielectric material housing 10. The U-shaped wall section 30 of the dielectric material housing has less electrical capacitance per unit area than its wall sections which form the side surfaces 14, 15.

The U-shaped wall section 30 contains a material having a lower dielectric constant than the material which forms the side surfaces 14, 15 of the dielectric material housing 10. The material of the U-shaped wall section 30 advantageously has a pore structure, and is preferably in the form of a foam material or a plastic filled with hollow balls. Dielectric constants of about 2 can be achieved with such a material. A material with a low dielectric constant, and, in addition, high mechanical strength may have a sandwich structure with a layer which forms the outer surface of the wall section and a layer which forms the inner surface of the wall section each being composed of a mechanically high-quality dielectric material, for example a laminate based, for example, on epoxy and glass fibers, and a thicker layer (arranged in between) composed of a material having a low dielectric constant, for example foam material or plastic filled with hollow bodies. The laminate used in this case also forms the side surfaces 14, 15 and has a dielectric constant of at least four while, in contrast, the dielectric constant of the material having a sandwich structure has a mean value of somewhat more than 2.

In order to improve the insulation, the cap-shaped control electrode 28 is arranged between the assembly 4 and the U-shaped wall section 30. This control electrode is arranged at a distance from the wall section 30, to be precise such that the distance increases from the front face 13 of the dielectric material housing 10 toward the DC isolation point formed by the transformer. This ensures that the electrical field is homogenized particularly well between high voltage and frame or ground potential, and dielectrically disadvantageous increased field areas are largely avoided. The control electrode 28 is advantageously composed of electrically conductive plastic and has a metallic coating on its inner side. The electrical field of the module $M_2$ can thus be capacitively controlled particularly well, and thus homogenized extremely advantageously, together with the metallic coating which is applied to the top surface 11, the front face 13 and the bottom surface 12 of the U-shaped wall section 30.

Figure 7:
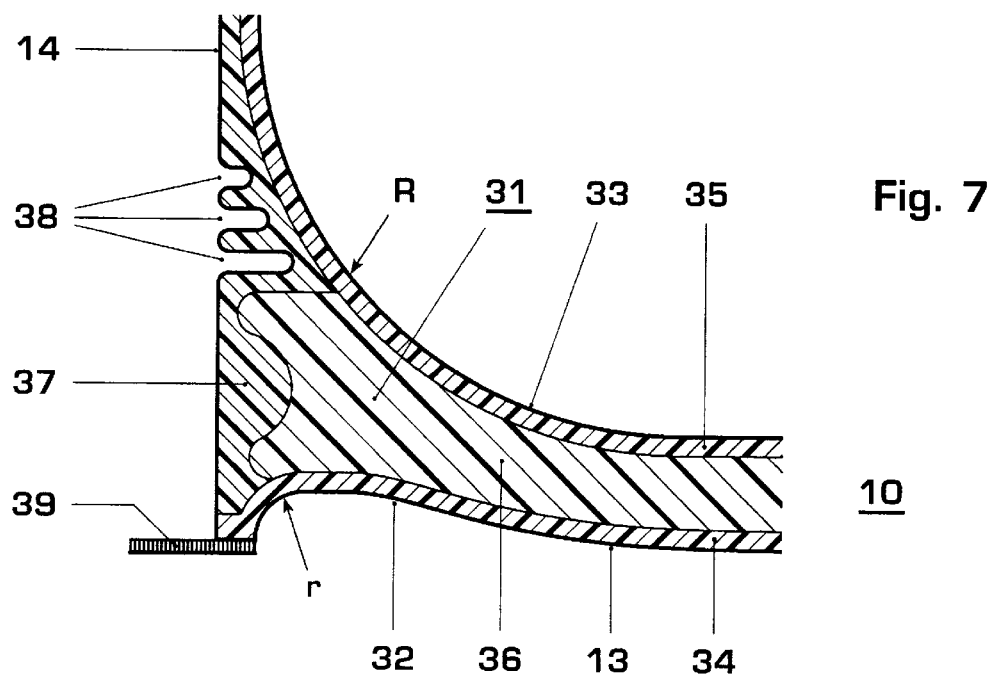
FIG. 7 shows an enlarged illustration of a section of a dielectric material housing of the module $M_2$, which is shown with a boundary round it in FIG. 3.

FIG. 7 shows the configuration and the material structure of the dielectric material housing 10 in the dielectrically particularly highly loaded junction region between the front face 13 and the side surface 14. This dielectrically highly loaded region is designed as a rim profile 31 and continues into the rims of the side surface 14, which are adjacent to the top surface 11 and bottom surface 12. The dielectrically highly loaded rim profile 31 surrounds the contact 16, which is provided in the side surface 14, in a U-shape (see FIGS. 4 and 6). A corresponding profile is also provided on the side surface 15. The rim profile 31 is angled. One limb of the angle, which extends into the side surface 14, is formed by the mechanically high-quality material with a comparatively high dielectric constant. The limb of the angle which extends into the front face 13, the top surface 11 and the bottom surface 12 has a sandwich structure. The outer surface (formed by the front face 13 and the side surface 14) and the inner surface 33 of this sandwich structure are each formed by layers 34, 35 of a material having a relatively high dielectric constant. A relatively thick layer 36 located in between is formed from the material having a relatively low dielectric constant. Thus, overall, the material of the sandwich structure has a relatively low dielectric constant in comparison with the material in the side surface 14. This material structure considerably assists the homogenization of the electrical field on the surface of the rim profile 31.

On its inner surface 33 facing the power-electronics assembly 4, the rim profile 31 has a concave surface which is formed by an electrically conductive coating and has a greater radius of curvature R than a concave surface 32 which is arranged on its front face 13, is curved in the opposite direction, is formed by an electrically conductive coating and has a radius r. The electrical field in the rim profile 31 is homogenized by the magnitudes of the radii and the opposing curvatures of the surfaces 32, 33, which are designed to be electrically conductive and are preferably metallized, and the electrical field is thus distributed even better on the uncoated side surface 14.

The rim profile 31 has a bead 37 which is designed in a U-shape and is composed of the same material as the side surface 14. This bead extends from the rim of the side surface 14 into the layer 36 composed of the material having a low dielectric constant. Together with the material of the layer 36, this bead produces additional homogenization of the electrical field on that part of the surface of the rim profile 31 which is located on the side surface 14. Grooves 38 which are surrounded by the bead 37 and run parallel to the rim are also formed in the side surface 14. These grooves on the one hand reduce the electrical field strength in the region of the bead 37, and on the other hand lengthen the creepage path along the surface of the rim profile 31 between frame or ground potential and high voltage (contact 16). The lengthened creepage path is advantageous particularly for improving the dielectric strength of the housing 10 in the event of contamination and/or in the event of moisture.

The bead 37 and the grooves 38 can be stamped into the side surface 14 in a manner which is advantageous for production reasons. An insulating barrier 39 which extends beyond the side surface 14 is adjacent to the concave outer surface 32. This barrier prevents the origination of surface charges, which originate from frame or ground potential.

Figure 8:
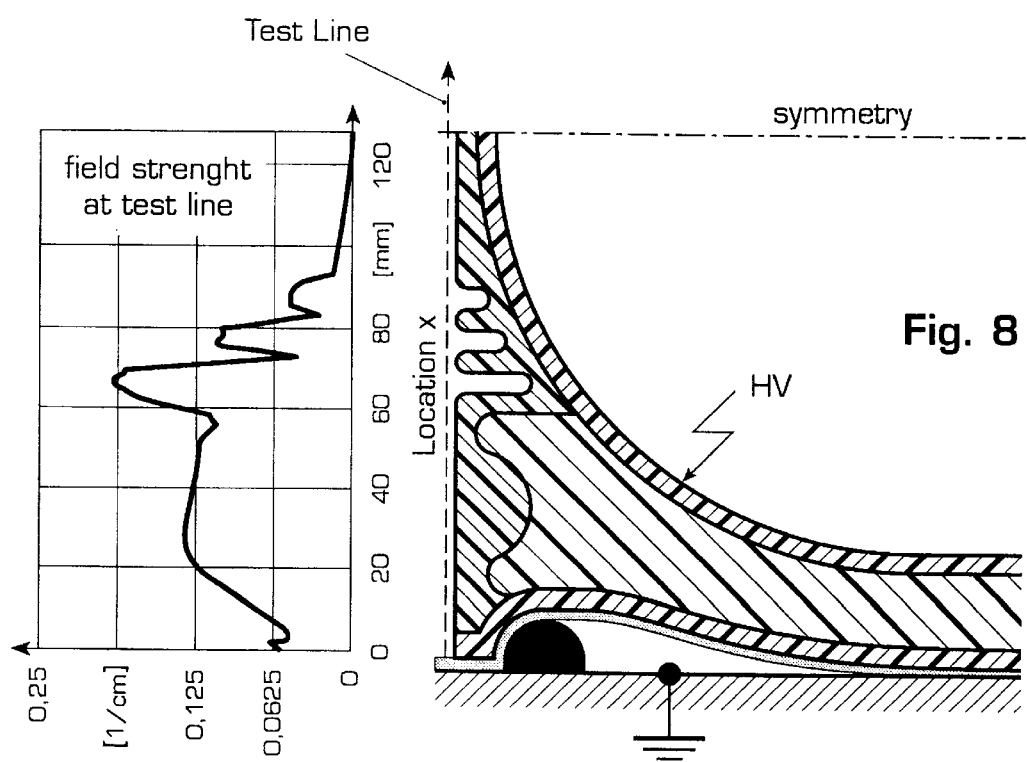
FIG. 8 shows a diagram, illustrating the distribution along a test line of the electrical field strength which acts on the dielectric material housing section shown in FIG. 7.

As can be seen from FIG. 8, the electrical field strength in the region of the bead 37 is virtually independent of position. Relatively high field strength peaks admittedly occur in the region of the grooves 38. However, owing to the insulating airgaps there, these peaks are not critical. The resultant voltage drops across the grooves 38 reduce the electrical field strength along the surface of the rim profile 31 in the region of the bead 37, however. As can be seen, the electrical field strength on the dielectric material barrier 39 is particularly low.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A module ($M_1$, $M_2$, . . . ) of a circuit arrangement which is preferably contained in a drive for a railroad vehicle and is of modular construction, having a first power-electronics assembly (4) which is at high voltage, a second power-electronics assembly (6) which is at a lower potential, and a transformer (5) which couples the first assembly (4) and the second assembly (6) forming a DC isolation point, wherein the first assembly (4) and electrical connections of the transformer (5) which are connected to it are arranged in a dielectric material housing (10) which is normally designed in a cuboid shape, wherein the dielectric material housing (10) in each case has an electrically conductive layer, which is connected to frame or ground potential, on its top surface (11) and bottom surface (12) as well as on its front face (13) which is closed at the front, and wherein an electrical connection of the first power-electronics assembly (4) is passed through each of the two side surfaces (14, 15) of the module ($M_1$, $M_2$ , . . . ).

2. The module as claimed in claim 1, wherein, in addition, the transformer (5) and the second power-electronics assembly (6) are arranged in the dielectric material housing (10), and wherein the dielectric material housing (10) furthermore accommodates an insulating intermediate wall (25) which separates the first assembly (4) from the transformer (5) and from the second assembly (6), and through which the electrical connections of the transformer (5), which are at high voltage, are passed.

3. The module as claimed in claim 2, wherein the bushings of the electrical connections of the transformer (5) are designed in the form of a cable termination (26, 27).

4. The module as claimed in claim 3, wherein the cable terminations (26, 27) are firmly connected to the intermediate wall (25) and project into an area which is shielded by a control electrode (28) in the form of a cap and accommodates the first power-electronics assembly (4).

5. The module as claimed in claim 2, wherein cooling channels (29) are formed in the intermediate wall.

6. The module as claimed in claim 2, wherein the intermediate wall (25) is firmly connected to the transformer (5).

7. The module as claimed in claim 2, wherein the first and the second power-electronics assembly (4, 6) as well as the transformer (5) are inserted into the dielectric material housing (10).

8. The module as claimed in claim 1, wherein the electrical insulation between the first power-electronics assembly (4) and the electrically conductive layers which are connected to frame or ground potential comprises a section (30) of the wall of the dielectric housing (10), which section (30) is designed essentially in U-shape and extends from the top surface (11), over the front face (13), to the bottom surface (12).

9. The module as claimed in claim 8, wherein a control electrode (28) is arranged between the first power-electronics assembly (4) and the U-shaped wall section (30) of the dielectric material housing (10), which control electrode (28) is at a distance from the U-shaped wall section (30) and is in the form of a cap, and whose distance from the front face (13) of the dielectric material housing (10) increases toward the DC isolation point.

10. The module as claimed in claim 9, wherein the control electrode (28) is composed of electrically conductive plastic and has a metallic coating on its inside.

11. The module as claimed in claim 8, wherein the U-shaped wall section (30) of the dielectric material housing (10) has less electrical capacitance per unit area than its wall sections which form the side surfaces (14, 15).

12. The module as claimed in claim 11, wherein the thickness of the wall section (30) is greater than that of the side surfaces (14, 15).

13. The module as claimed in claim 11, wherein the U-shaped wall section (30) contains a material having a lower dielectric constant than the side surfaces (14, 15).

14. The module as claimed in claim 13, wherein the material of the U-shaped wall section (30) has a pore structure, and is preferably in the form of foam, or plastic filled with hollow bodies.

15. The module as claimed in claim 13, wherein the U-shaped wall section (30) has a sandwich structure with a layer (34) which forms the outer surface of the wall section (30) and a layer (35) which forms the inner surface (33) of the wall section (30), which layers are each composed of a mechanically high-quality insulating material, and having a thicker layer (36) which is arranged in between and is composed of the material having a low dielectric constant.

16. The module as claimed in claim 8, wherein at least one rim profile (31) is formed in the U-shaped wall section, merges into one of the two side surfaces (14) and in each case has (on its inner side facing the power-electronics assembly (4) which carries high voltage) a first concave surface (33) having a greater radius of curvature than a second concave surface (32) which is arranged on its outer side and is curved in the opposite direction.

17. The module as claimed in claim 16, wherein the at least one rim profile (31) has a bead (37) which is designed in a U-shape, is composed of the same material as the side surface (14, 15) and extends from the rim of the associated side surface (14) into the material whose dielectric constant is less than that of the material of the side surfaces (14, 15).

18. The module as claimed in claim 17, wherein grooves (38) which are surrounded by the bead (37) and run parallel to the rim are formed in the side surface (14) which is associated with the bead (37).

19. The module as claimed in claim 18, wherein the bead (37) and the grooves (38) are stamped into the side surface (14).

20. The module as claimed in claim 16, wherein the first concave surface (32) and the second concave surface (33) are provided with a metallic coating.

21. The housing as claimed in claim 16, wherein an insulating barrier (39) which projects beyond the side surface (14) is adjacent to the second concave surface (32).

* * * * *